(12) United States Patent
Ahn

(10) Patent No.: US 7,494,874 B2
(45) Date of Patent: Feb. 24, 2009

(54) METHOD OF MANUFACTURING A FLASH MEMORY DEVICE

(75) Inventor: Myung-Kyu Ahn, Icheon-si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 11/768,724

(22) Filed: Jun. 26, 2007

(65) Prior Publication Data

US 2008/0038899 A1    Feb. 14, 2008

(30) Foreign Application Priority Data

Aug. 9, 2006    (JP)    ............................ 10-2006-75201

(51) Int. Cl.
*H01L 21/336* (2006.01)
(52) U.S. Cl. ............. 438/265; 438/424; 438/FOR. 221; 257/E21.54
(58) Field of Classification Search ................. 438/257, 438/265, 424, E21.54, FOR. 221
See application file for complete search history.

(56) References Cited

U.S. PATENT DOCUMENTS

2006/0017093 A1*    1/2006    Kwon et al. ................. 257/315

* cited by examiner

*Primary Examiner*—W. David Coleman
(74) *Attorney, Agent, or Firm*—Marshall, Gerstein & Borun LLP

(57) ABSTRACT

A method of manufacturing a flash memory device includes the steps of forming a tunnel oxide layer and a polysilicon layer over a semiconductor substrate. An etch process is then performed to form a pattern and a trench. An isolation layer is formed in the trench. A polysilicon spacer layer is formed on the resulting surface. A specific region of the polysilicon spacer layer and the isolation layer is etched in a single etch process to form a recess hole in a central portion of the isolation layer. The polysilicon spacer layer is then removed.

9 Claims, 2 Drawing Sheets

METHOD OF MANUFACTURING A FLASH MEMORY DEVICE

CROSS-REFERENCE TO RELATED APPLICATION

Priority to Korean patent application number 2006-75201, filed on Aug. 9, 2006, the disclosure of which is incorporated by reference in its entirety, is claimed.

BACKGROUND OF THE INVENTION

The invention relates, in general, to a method of manufacturing a flash memory device and, more particularly, to a method of forming a recess in an isolation layer.

In the case of a NAND flash memory device of 70 nm or less, greater interference between elements occurs in a multi-level cell (MLC) than in a single-level cell (SLC). Among the interferences affecting the elements, the interference between the floating gates is the greatest. In order to increase the reliability of a device, the interference between the floating gates should be reduced.

In a conventional manufacturing process for a flash memory device, the top surface of an isolation layer is recessed to reduce the interference between electrodes. However, it is difficult to improve yield and reliability because there are many process steps and thickness control is difficult.

SUMMARY OF THE INVENTION

Accordingly, the invention addresses the above problems and provides a method of manufacturing a flash memory device, where a tunnel oxide layer and a polysilicon layer are formed over a semiconductor substrate. An etch process is then performed to form a pattern and a trench. An isolation layer is formed in the trench. A polysilicon spacer layer is formed on the resulting surface. A specific region of the polysilicon spacer layer and the isolation layer is etched in a single etch process to form a recess hole in a central portion of the isolation layer. The polysilicon spacer layer is then removed.

An amorphous-carbon layer preferably is used as a first polysilicon spacer layer, so that the number of etch process steps can be reduced and a recess process can be performed to a desired depth.

DESCRIPTION OF SPECIFIC EMBODIMENTS

Now, a specific embodiment according to the disclosure is described with reference to the accompanying drawings.

FIGS. 1 to 4 are cross-sectional views illustrating a method of manufacturing a flash memory device according to an embodiment of the invention.

Figure 1:
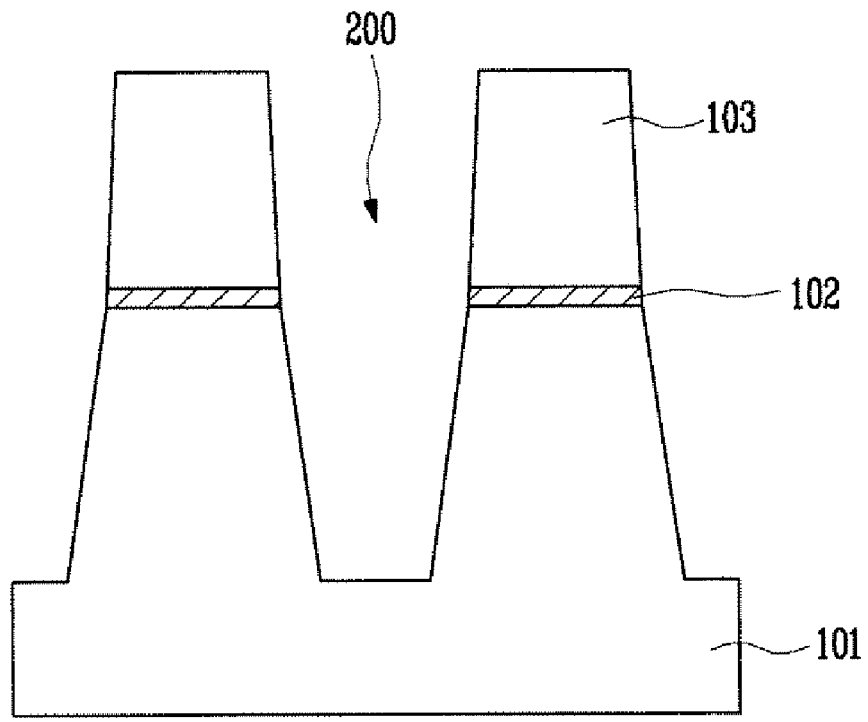
FIGS. 1 to 4 are cross-sectional views illustrating a method of manufacturing a flash memory device according to an embodiment of the invention.

Referring to FIG. 1, a tunnel oxide layer 102 and a polysilicon layer 103 for a floating gate are formed over a semiconductor substrate 101 by means of a self-aligned floating gate (SA-FG) scheme and a self-aligned shallow trench isolation (SA-STI) scheme. In other words, the gate oxide layer 102 and the polysilicon layer 103 are formed over the semiconductor substrate 101. A gate pattern is formed using an etch process. A trench 200 is then formed in the semiconductor substrate 101.

Figure 2:
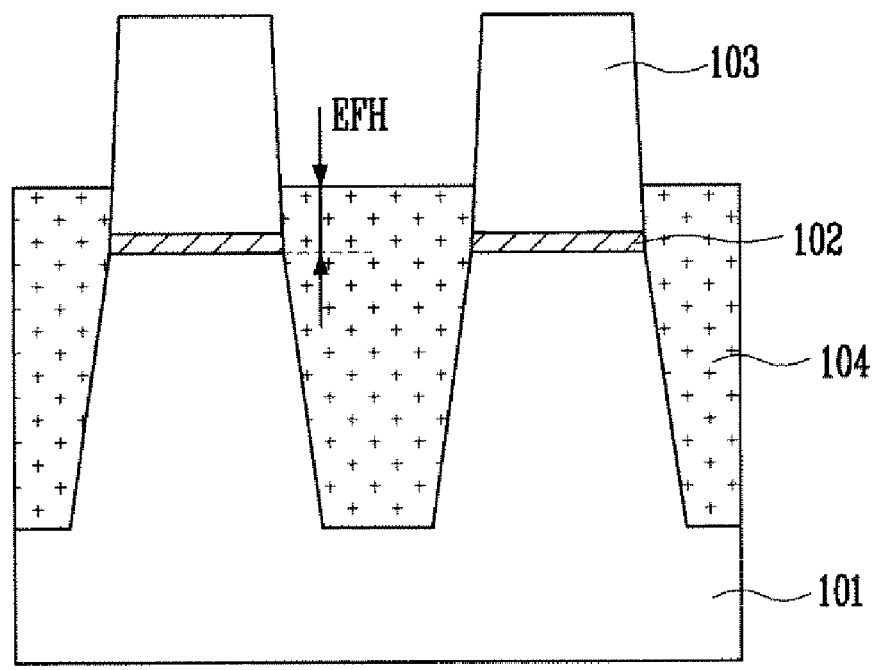

Referring to FIG. 2, an isolation layer 104 is formed on the entire surface to fill the trench. The isolation layer 104 is polished preferably using a chemical mechanical polishing (CMP) process until the polysilicon layer 103 is exposed. A dry or wet etch process is preferably performed to etch the isolation layer 104 to a specific depth. In this case, the effective floating gate height (EFH) from the tunnel oxide layer 102 to the top surface of the isolation layer 104 is preferably set in the range of 100 Angstroms to 600 Angstroms. This height corresponds to a height in the final resulting structure. In this case, it is not necessary to take into consideration the loss upon a subsequent etch process.

Figure 3:
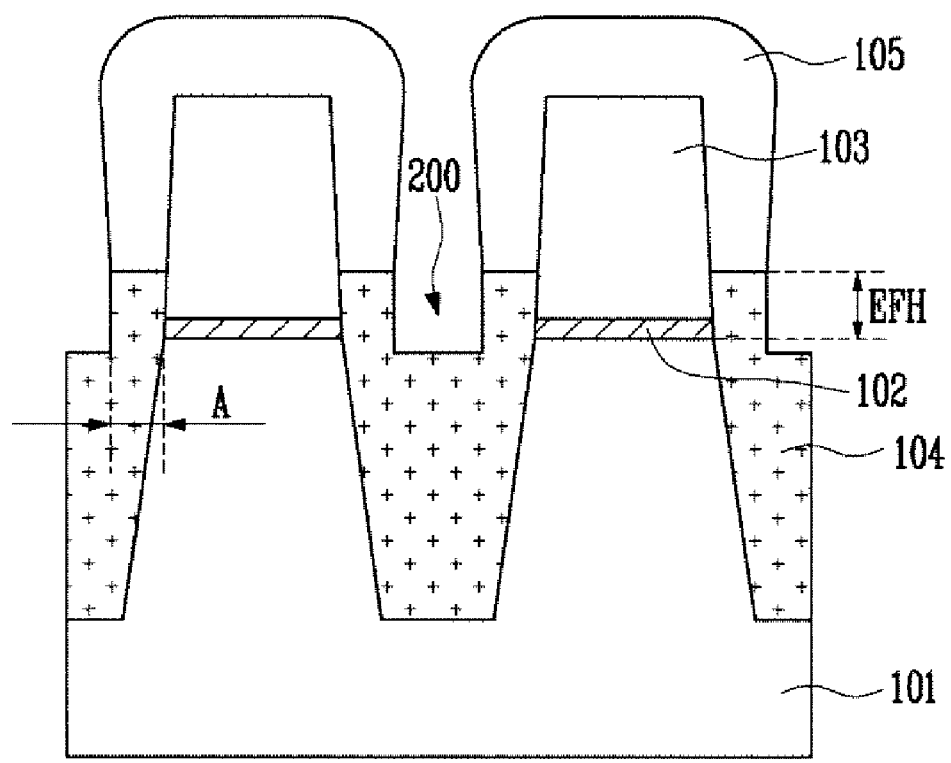

Referring to FIG. 3, an amorphous-carbon layer 105 to be as a spacer for the polysilicon layer 103 is formed on the entire surface. However, a low-k material or an oxide layer, such as undoped silicate glass (USG) having a high etch rate, can be used instead of the amorphous-carbon layer 105.

After the amorphous-carbon layer 105 is formed, a portion to be recessed is etched using a dry etch process, thereby forming a recess hole 200. The recess hole 200 preferably has a depth ranging from −300 Angstroms to 300 Angstroms relative to the active top of the semiconductor substrate 101 and also preferably has a width ranging from 100 Angstroms to 500 Angstroms. The active top of the semiconductor substrate is located at the interface between the semiconductor substrate 101 and the tunnel oxide layer 102. A negative value for the depth of the recess hole 200 indicates that the bottom of the recess hole 200 is located above the substrate-tunnel oxide interface (i.e., in a direction away from the bottom of the trench 200). A positive value for the depth of the recess hole 200 indicates that the bottom of the recess hole 200 is located below the substrate-tunnel oxide interface (i.e., in a direction toward the bottom of the trench 200). The thickness of the recess hole 200 (i.e., the distance A between the sidewall of the recess hole 200, and the active top of the semiconductor substrate 101; see FIG. 3) is preferably equivalent to the height EFH from the active top of the semiconductor substrate to the top surface of the isolation layer 104.

In the dry etch process, preferably one of $SF_6$, $NF_3$, a fluorocarbon-based $C_xF_y$ (e.g., $CF_4$), a fluoro-hydrocarbon-based $C_xH_yF_z$, $Cl_2$, $BCl_3$, HBr, HI, or a combination thereof is used as an etch gas. Further, one of $O_2$, $N_2$, CO, $H_2$, or a combination thereof is preferably added to the etch gas to control the etch rate and the resulting etch shape of the dry etch process.

Figure 4:
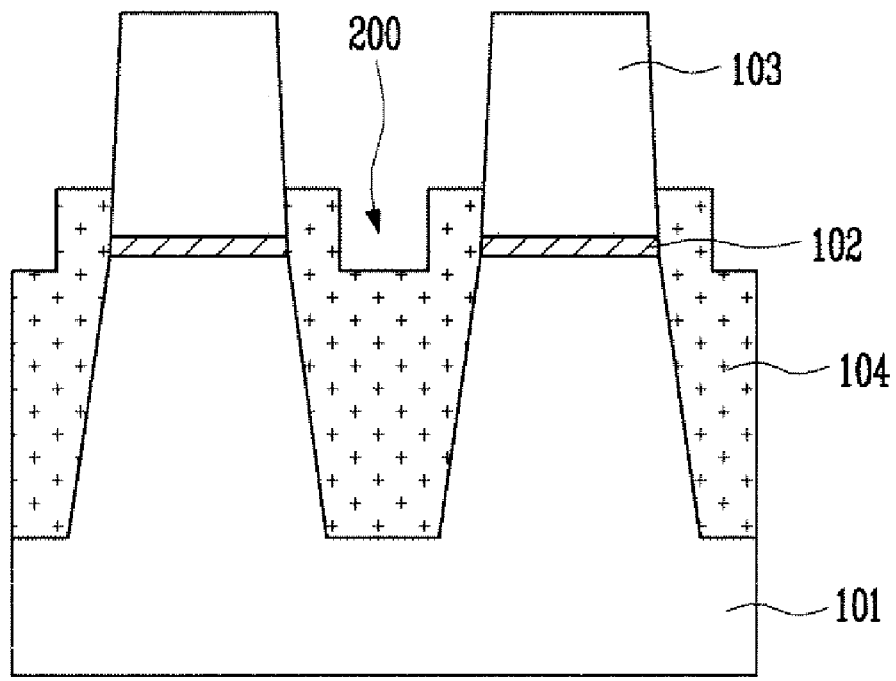

Referring to FIG. 4, the amorphous-carbon layer 105 is fully removed. The amorphous-carbon layer 105 is preferably removed using a plasma etch method used to remove a photoresist by using one of $O_2$, $N_2$, $H_2$, or a combination thereof.

As described above, according to the invention, because a spacer layer is used as a spacer for a first polysilicon layer, the number of etch process steps can be reduced and a recess process can be performed to a desired depth. Accordingly, production costs can be reduced while yield and reliability can be increased.

Although the foregoing description has been made with reference to the illustrated embodiment, it is to be understood that changes and modifications may be made by the ordinarily skilled artisan without departing from the spirit and scope of the disclosure and appended claims.

What is claimed is:

1. A method of manufacturing a flash memory device, comprising:

forming a tunnel oxide layer and a polysilicon layer over a semiconductor substrate and then performing an etch process to form a pattern and a trench;

forming an isolation layer in the trench;

forming a spacer layer on an exposed surface of the polysilicon layer;

etching an exposed portion of the isolation layer using the spacer layer as a mask to form a recess hole in a central portion of the isolation layer; and removing the spacer layer.

2. The method of claim 1, wherein the isolation layer has a height of 100 Angstroms to 600 Angstroms measured from the bottom of the tunnel oxide layer to the top of the isolation layer.

3. The method of claim 1, wherein the spacer layer is selected from the group consisting of amorphous-carbon layers, low-k materials, and oxide layers.

4. The method of claim 1, wherein removing the spacer layer comprises performing a plasma etch method to remove a photoresist by using one selected from the group consisting of $O_2$, $N_2$, $H_2$, and combinations thereof.

5. The method of claim 3, wherein the spacer layer comprises undoped silicate glass (USG).

6. The method of claim 3, wherein the spacer layer comprises the amorphous-carbon layer and etching to form a recess hole comprises performing a dry etch process.

7. The method of claim 6, wherein the dry etch process comprises using one selected from the group consisting of $SF_6$, $NF_3$, $CF_4$, fluorocarbon-based $C_xF_y$ compounds, fluorohydrocarbon-based $C_xH_yF_z$ compounds, $Cl_2$, $BCl_3$, HBr, HI, and combinations thereof.

8. The method of claim 6, wherein the recess hole has a bottom depth of −300 Angstroms to 300 Angstroms relative to an active top of the semiconductor substrate and a width of 100 Angstroms to 500 Angstroms.

9. The method of claim 7, wherein the dry etch process further comprises using one selected from the group consisting of $O_2$, $N_2$, CO, $H_2$, and combinations thereof to control the etch rate and the resulting etch shape of the dry etch process.

* * * * *